United States Patent
Qu et al.

(10) Patent No.: US 8,759,888 B2
(45) Date of Patent: Jun. 24, 2014

(54) SUPER TRENCH SCHOTTKY BARRIER SCHOTTKY DIODE

(71) Applicants: Ning Qu, Reutlingen (DE); Alfred Goerlach, Kusterdingen (DE)

(72) Inventors: Ning Qu, Reutlingen (DE); Alfred Goerlach, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 29 days.

(21) Appl. No.: 13/691,038

(22) Filed: Nov. 30, 2012

(65) Prior Publication Data

US 2013/0161779 A1    Jun. 27, 2013

(30) Foreign Application Priority Data

Dec. 1, 2011  (DE) .......................... 10 2011 087 596

(51) Int. Cl.
*H01L 29/80* (2006.01)
*H01L 31/112* (2006.01)

(52) U.S. Cl.
USPC 257/284; 257/594; 257/E27.04; 257/E29.338

(58) Field of Classification Search
USPC ............ 257/109, 281, 284, 473, 594, E27.04, 257/E29.338
See application file for complete search history.

(56) References Cited

U.S. PATENT DOCUMENTS

2012/0199902 A1*   8/2012   Kao ............................... 257/331

FOREIGN PATENT DOCUMENTS

DE    10 2010 043 088    5/2012

* cited by examiner

*Primary Examiner* — Hoai V Pham
(74) *Attorney, Agent, or Firm* — Kenyon & Kenyon LLP

(57) ABSTRACT

A Schottky diode includes an $n^+$-substrate, an n-epilayer, trenches introduced into the n-epilayer, floating Schottky contacts being located on their side walls and on the entire trench bottom, mesa regions between the adjacent trenches, a metal layer on its back face, this metal layer being used as a cathode electrode, and an anode electrode on the front face of the Schottky diode having two metal layers, the first metal layer of which forms a Schottky contact and the second metal layer of which is situated below the first metal layer and also forms a Schottky contact. Preferably, these two Schottky contacts have different barrier heights.

9 Claims, 3 Drawing Sheets

SUPER TRENCH SCHOTTKY BARRIER SCHOTTKY DIODE

CROSS REFERENCE TO RELATED APPLICATION

The present application claims priority to Application No. DE 10 2011 087 596.4, filed in the Federal Republic of Germany on Dec. 1, 2011, which is incorporated herein in its entirety by reference thereto.

FIELD OF INVENTION

The present invention relates to a Schottky diode which is suitable for high-voltage applications and has a low forward voltage, a low leakage current and a low switching power loss.

BACKGROUND INFORMATION

High-voltage PN diodes are generally used for high-voltage applications. Such high-voltage PN diodes advantageously have a low leakage current and a high robustness. Disadvantages of such high-voltage PN diodes are that they have a high forward voltage and a high switching power loss.

In a high-voltage PN diode of this type, the voltage is primarily taken over by the slightly doped region which is provided in such diodes. In the case of operation in the forward direction, electrons and holes are injected into the slightly doped region. At a high current density, high injection prevails in the slightly doped region and the electron and hole densities are greater than the doping concentration of the slightly doped region. This increases the conductivity of the slightly doped region. This advantageously results in a reduction of the forward voltage. However, the current of a high-voltage PN diode at room temperature does not begin to flow until forward voltage UF=0.7 V, for example. Under normal operating conditions, for example, at a current density which is greater than 100 A/cm², forward voltage UF rises to values greater than 1 V. This is associated with a correspondingly high, undesirable power loss. Since a high-voltage PN diode requires a thick slightly doped region, the voltage drop in the forward direction is relatively great across the slightly doped region despite the conductivity modulation.

The charge carriers (electrons and holes), which are injected into the slightly doped region and stored there during the operation in the forward direction, must be reduced at the time of a shut-off, for example, at the time of an abrupt current commutation, before the high-voltage PN diode is actually capable of taking over the reverse voltage again. For that reason, the current first flows in the reverse direction at the time of an abrupt current commutation until the stored charge carriers are reduced or removed. This process, i.e., the level and the duration of the drain current for reducing the stored charge carriers, is primarily determined by the volume of the charge carriers stored in the slightly doped region. A higher and longer lasting drain current means a higher turn-off power loss.

If high-voltage Schottky diodes are used instead of high-voltage PN diodes in high-voltage applications, the turn-off power loss is advantageously reduced. A high-voltage Schottky diode is a majority charge carrier component, in which no high injection occurs even at high current density during operation in the forward direction, i.e., no injection of electrons and holes into the slightly doped region. However, since no injection with conductivity modulation occurs in the case of a high-voltage Schottky diode, a high voltage drops at the slightly doped region during operation with high currents. This has previously limited the use of high-blocking Schottky diodes to very low currents. Additional disadvantages of high-voltage Schottky diodes are the high leakage currents, in particular at high temperature, as well as their severe voltage dependence due to the barrier-lowering effect.

In German Application No. DE 10 2010 043 088.9, a Schottky diode is described which has the advantage of a low turn-off power loss and, at least partially, overcomes the disadvantages of a high forward voltage and high leakage currents occurring in customary high-voltage Schottky diodes. Such a Schottky diode, which is also referred to as a super trench Schottky barrier diode (STSBD), is shown in FIG. 1. It has an n⁺-substrate 10, an n-epilayer 20, trenches 30 etched into n-epilayer 20, each of which has a width Wt and a distance D_epi to the n⁺-substrate, mesa regions 40 having a width Wm between adjacent trenches 30, a metal layer 50 acting as a Schottky contact and used as an anode electrode on front face V of the Schottky diode implemented as a chip, a metal layer 60 acting as a cathode electrode on back face R of the chip, and additional Schottky contacts 70 on the walls of trenches 30. Each of these additional Schottky contacts 70 has a width D_sk in the direction to n*-substrate 10 and a distance D_gap to each next additional Schottky contact 70. Metal layer 50 covers each of the trench walls to a depth D_anode and has a distance D_gap to each adjacent first additional Schottky contact 70. Schottky contacts 70 float on the trench walls. Each additional Schottky contact 70 closest to n*-substrate 10 covers one trench bottom each. Any number of floating contacts may be selected. Preferably, significantly more contacts are selected than are represented in FIG. 1.

In an STSBD of this type, the space charge region in n-epilayer 20 expands in the reverse direction with increasing voltage toward the trench bottom. If the space charge region at a voltage V1 reaches the first floating Schottky contact, this voltage V1 is taken over by the first floating Schottky contact. The space charge region expands with continuously increasing voltage toward the trench bottom. The voltage at the first floating Schottky contact remains unchanged.

In a similar way, the space charge region at a higher voltage Vn reaches the nth floating Schottky contact. In this connection, the nth floating Schottky contact takes over voltage Vn. In turn, with a continuing increase in voltage, the voltage on the nth floating Schottky contact remains unchanged.

If width D_sk and distance D_gap in the STSBD structure are selected to be equal for all additional Schottky contacts 70, a periodically homogeneous field distribution is present in mesa region 40. The field distribution in the mesa region is continuously repeated according to a distance D_sk+D_gap until the trench bottom is finally reached. The voltage distribution in mesa region 40 is then largely linear. Compared to conventional high-voltage PN diodes or high-voltage Schottky diodes, in the case of the STSBD, a significantly higher voltage may be accommodated at a predefined thickness of the slightly doped region.

This results in a very advantageous compromise between breakdown voltage, forward voltage and turn-off power loss.

SUMMARY

A Schottky diode according to the present invention advantageously has a low forward voltage, a low leakage current and a low turn-off power loss. These advantages are achieved by a Schottky diode, which has an n⁺-substrate, an n-epilayer, trenches introduced in the n-epilayer which have a distance to the n⁺-substrate, mesa regions between adjacent trenches and a metal layer on its back face, this metal layer being used as a cathode electrode, an anode electrode being provided on the front face of the Schottky diode, the anode electrode having two metal layers, the first of which forms a Schottky contact and the second of which is situated below the first one and also forms a Schottky contact, and additional floating Schottky contacts being provided below the second metal layer.

Exemplary embodiments and additional advantageous properties of the present invention are described in the following with reference to the accompanying drawings.

DETAILED DESCRIPTION

Figure 1:
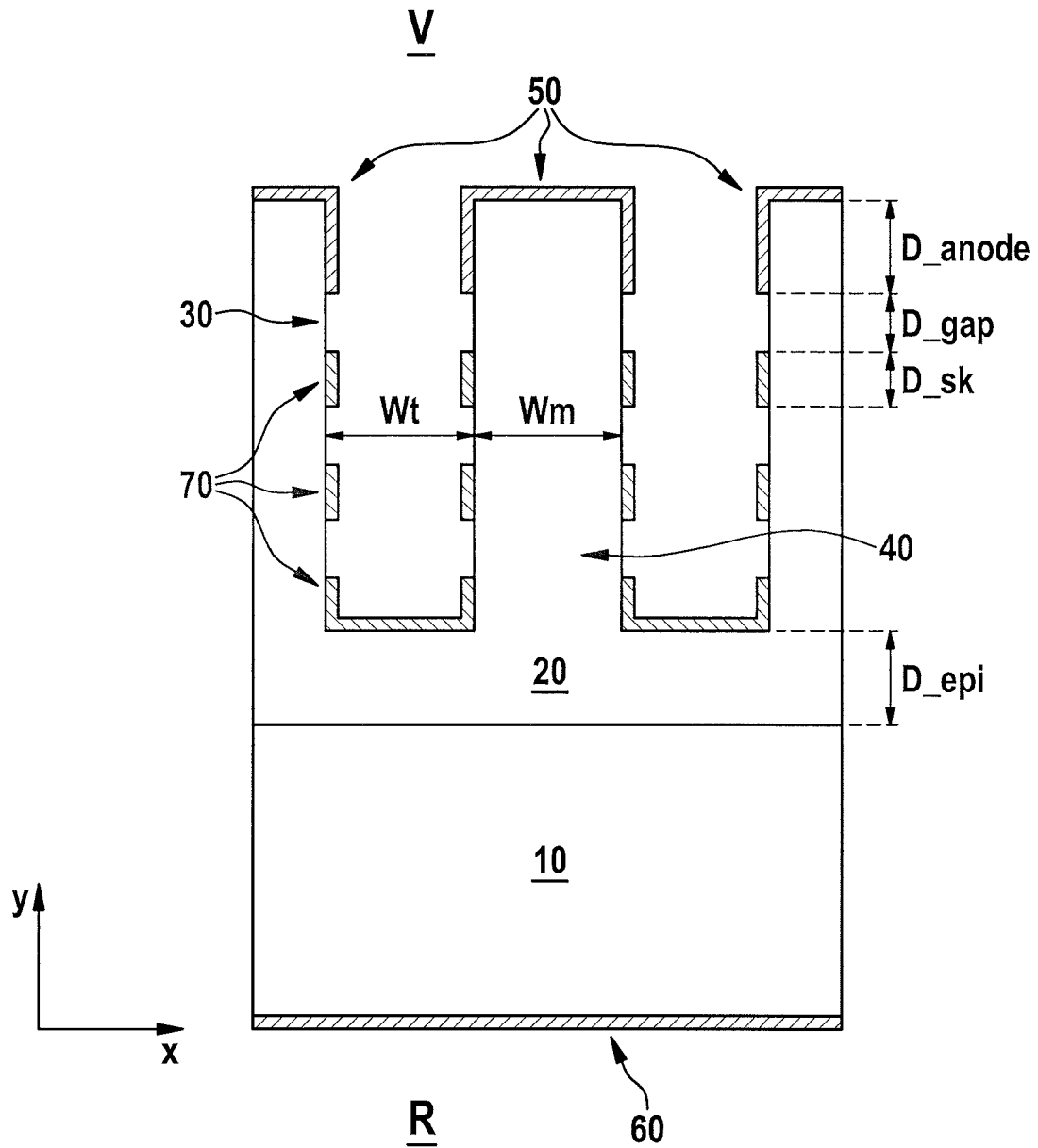
FIG. 1 shows a schematic representation of a super trench Schottky barrier diode (STSBD) according to the related art.
Figure 2:
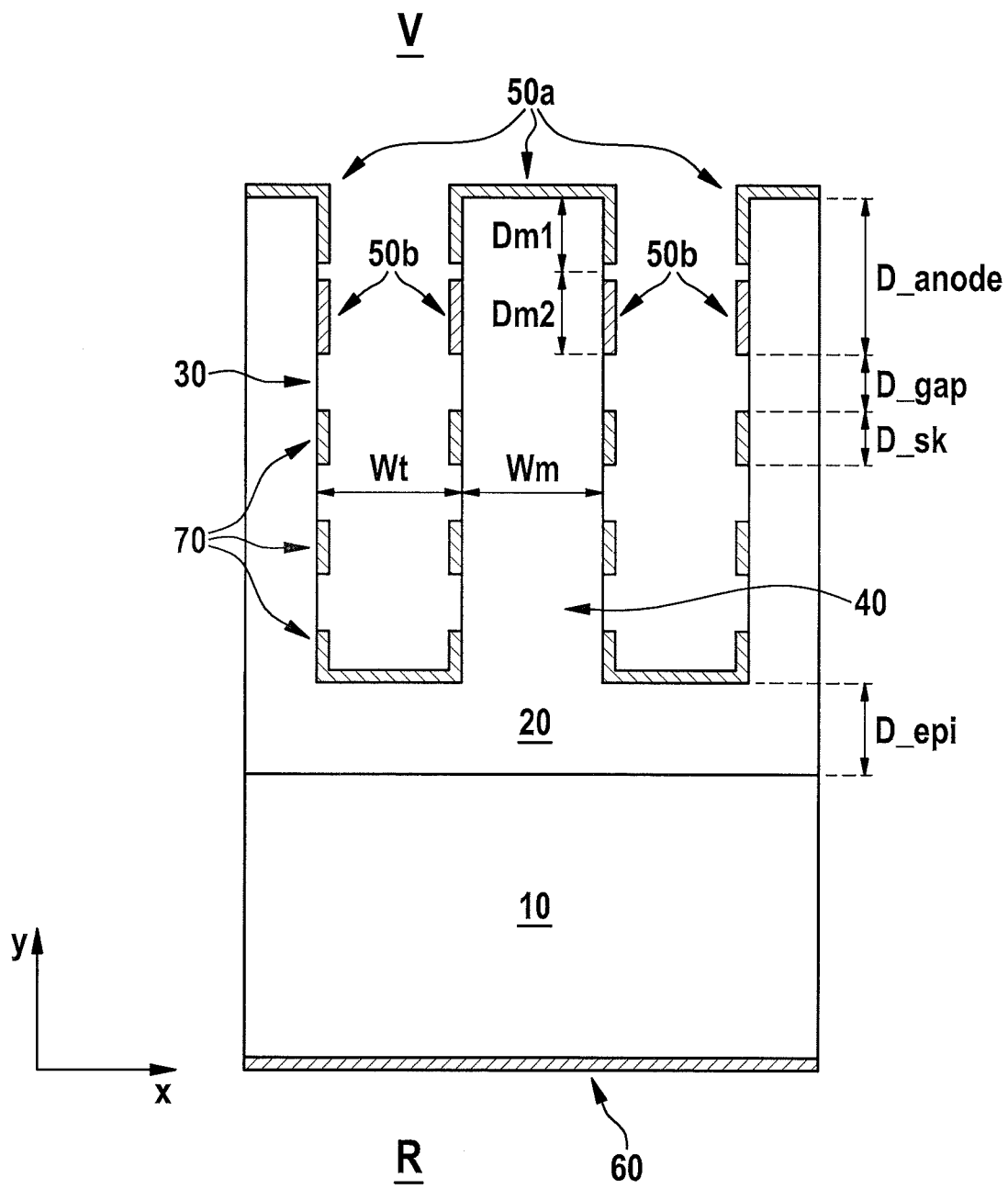
FIG. 2 shows a schematic representation of a super trench Schottky barrier Schottky diode (STSBS) according to an exemplary embodiment of the present invention.

FIG. 2 shows a Schottky diode which will also be referred to in the following as a super trench Schottky barrier Schottky diode or as STSBS.

The STSBS shown has an $n^+$-substrate 10, an n-epilayer 20, trenches 30 introduced into n-epilayer 20 preferably by etching, mesa regions 40 between adjacent trenches 30, on their back face R a metal layer 60, on their front face V an anode electrode made up of two metal layers 50a and 50b, each of which is used as a Schottky contact, metal layer 50a extending partially and metal layer 50b extending entirely along a trench side wall, and metal layers 50a and 50b being connected electrically or separated only by a minimal distance, and additional Schottky contacts 70, which in FIG. 2 are positioned below second metal layer 50b and extend along a trench side wall.

Each of trenches 30 has a width Wt and a distance D_epi from $n^+$-substrate 10. Each of mesa regions 40 has a width Wm. Metal layer 60 on back face R of the Schottky diode preferably implemented as a chip is used as a cathode electrode. Additional Schottky contacts 70, which are situated along the trench side walls, have a width D_sk. A distance D_gap exists between additional Schottky contacts 70 which are adjacent to one another. A distance D_gap also exists between metal layer 50b and additional Schottky contact 70 which is adjacent to metal layer 50b.

The width of metal layer 50a amounts to Dm1. The width of metal layer 50b amounts to Dm2. Metal layers 50a and 50b, which act as Schottky contacts, cover the side walls of trenches 30 to a depth D_anode. Additional Schottky contacts 70 float on the side walls of trenches 30. Each lowest additional Schottky contact 70 in FIG. 2 covers the trench bottom.

Schottky contacts 50a and 50b are implemented to have different barrier heights. Schottky contact 50a on the front face of the chip preferably has a lower barrier height than Schottky contact 50b. The floating contacts may have a different barrier height than Schottky contacts 50a and 50b; however, they preferably have the barrier height of second Schottky contact 50b.

In the case of the STSBS according to the present invention, currents flow in the forward direction from Schottky contacts 50a and 50b as an anode electrode through mesa regions 40 and epilayer 20 between the trench bottoms and $n^+$-substrate 10 to metal layer 60 on back face R of the chip which is used as a cathode electrode. Currents are only forwarded via floating additional Schottky contacts 70 since they represent low-resistance current paths. Since Schottky contact 50a on chip front face V preferably has a significantly lower barrier height than Schottky contact 50b lying directly below it, Schottky contact 50a takes on significantly more current. For that reason, the forward voltage is primarily determined by the barrier height of Schottky contact 50a.

In the reverse direction, lower Schottky contact 50b having a greater barrier height provides for a greater extension of the space charge region in n-epilayer 20. The space charge region expands with increasing voltage and collides at a voltage which is lower than the breakdown voltage of the STSBS, in the center of the region between adjacent trenches 30. This screens the Schottky effects, which are responsible for the high reverse current, and reduces the reverse current. This screening effect is strongly dependent on structural parameters Wm (distance between the trenches), Dm1 (width of Schottky contact 50a on the chip front face) and Dm2 (width of Schottky contact 50b lying directly below).

The advantage of an STSBS is, on the one hand, the combination of the two Schottky contacts 50a and 50b, both of which are used as an anode electrode and have different barrier heights and which make possible a certain separation of the constructions with regard to the requirements of the forward voltage and the screening properties. Forward voltage UF and the initial value of leakage current IR0 are primarily influenced by Schottky contact 50a on chip front face V having a lower barrier height. UF is lower and IR0 is higher in direct proportion to the portion of Schottky contact 50a. On the other hand, Schottky contact 50b lying directly below having a greater barrier height determines the voltage dependence of the leakage current, the breakdown voltage and the current distribution at high reverse current. The STSBS therefore offers additional optimization possibilities by combining the two Schottky contacts as an anode electrode. Both widths Dm1 and Dm2 as well as the barrier heights of the two Schottky contacts may be used as parameters.

On the other hand, similar to an STSBD, an STSBS has the advantage of an almost linear voltage distribution in mesa regions 40 with the aid of floating Schottky contacts 70. In the reverse state, an STSBS may be understood as a series connection of multiple low-voltage diodes. However, in contrast to an ordinary series connection of diodes, in the forward operation only one forward voltage drops, namely the forward voltage of the Schottky diode which is made up of anode metals 50a/50b and n-epilayer 20. For that reason, compared to conventional high-voltage PN diodes or Schottky diodes at comparable breakdown voltages, the doping concentration of region 20 may be selected to be significantly higher in an STSBS, for example, by a factor of 5 to 10. This becomes more pronounced with an increase in the number of floating contacts. As a result, significantly less voltage drops on high-resistance region 20, or significantly higher forward current may flow at a comparable forward voltage One advantage of an STSBS according to the present invention compared to a conventional high-voltage Schottky diode is that in the case of an STSBS, the forward voltage is significantly lower in the region of high current densities, since the doping concentration of region 20 is substantially higher. Furthermore, a significantly lower leakage current occurs in the case of an STSBS.

One advantage of an STSBS according to the present invention compared to a conventional high-voltage PN diode is that the forward voltage stays low even at higher currents. This is attributed to the fact that in the case of an STSBS, a suitable selection of the barrier metal makes it possible to select the forward voltage measured at lower current densities to be lower than the comparable forward voltage of a PN diode. Furthermore, the rapid, low power turn-off properties of the STSBS represent a significant advantage compared to conventional high-voltage PN diodes. Since the STSBS is a Schottky diode and consequently is a majority charge carrier component, the turn-off power loss is significantly lower than that of a high-voltage PN diode.

One advantage of an STSBS according to the present invention compared to an STSBD is that an STSBS according to the present invention offers additional latitude in the design of the forward voltage and the leakage current. This is attributed to the fact that an STSBS has an anode electrode made up of two Schottky contacts, which makes it possible for these two Schottky contacts to be designed with different barrier heights.

Apart from an optimization with respect to the number of floating contacts 70, the following structural parameters may be optimized in the design of an STSBS as a function of the particular application present:

widths Dm1 and Dm2 of the two Schottky contacts 50*a* and 50*b*:
this makes it possible to coordinate between the leakage current and the forward voltage;
width D_sk of floating Schottky contacts 70 on the trench side walls:
this makes it possible to influence the decoupling of the individual periodic regions in mesa regions 40;
distance D_gap between Schottky contacts 70 which are adjacent to one another on the trench side walls:
this makes it possible to influence the linearity of the voltage distribution in mesa regions 40;
width Wt of trenches 30:
this makes it possible to influence the forward voltage;
width Wm of mesa regions 40:
this makes it possible to coordinate between the leakage current and the forward voltage;
distance D_epi between the trench bottoms and the $n^+$-substrate:
this makes it possible to coordinate between the total breakdown voltage and the voltage of the last Schottky contact in the case of a breakdown.

In light of the above, the present invention provides a high-voltage Schottky diode implemented using trench technology, which has a low forward voltage, a low forward current and low turn-off losses.

In the case of an STSBS according to the present invention, a trench structure having multiple floating Schottky contacts on the trench walls is implemented on the one hand. As a result, a periodically homogeneous field distribution and a nearly linear voltage distribution are formed in the mesa regions. The doping concentration for a predefined breakdown voltage may be selected, for example, to be higher by a factor of 5 to 10 than in the case of a conventional high-voltage PN diode or Schottky diode.

On the other hand, the anode electrode of an STSBS according to the present invention is made up of a Schottky contact on the front face of the chip having a lower barrier height and a Schottky contact lying directly below it having a greater barrier height. While the Schottky contact having the lower barrier height determines the forward voltage, the Schottky contact having the greater barrier height improves the voltage dependence of the leakage current.

Alternatively to the exemplary embodiment described above, a Schottky diode according to the present invention may also be implemented in that all of its semiconductor layers described above have the diametrically opposed conductivity type and the signs of the anode and cathode terminal are exchanged.

In the case of a Schottky diode according to the present invention, the doping concentration of n-epilayer 20 is preferably significantly higher than in a conventional high-voltage PN diode and a conventional high-voltage Schottky diode.

A Schottky diode according to the present invention advantageously has a breakdown voltage which is greater than 100 V, preferably even greater than 200 V.

Trenches 30 may have a rectangular shape, a U-shape or also another similar shape. They may be situated in strips or as islands. The islands may be designed to be circular, hexagonal or also in another way.

The metallization on the front face and the back face of the Schottky diode is preferably designed to be solderable.

A Schottky diode according to the present invention is preferably situated in a press-fit diode housing.

A Schottky diode according to the present invention may, for example, be a component of a rectifier of a motor vehicle generator.

Figure 3:
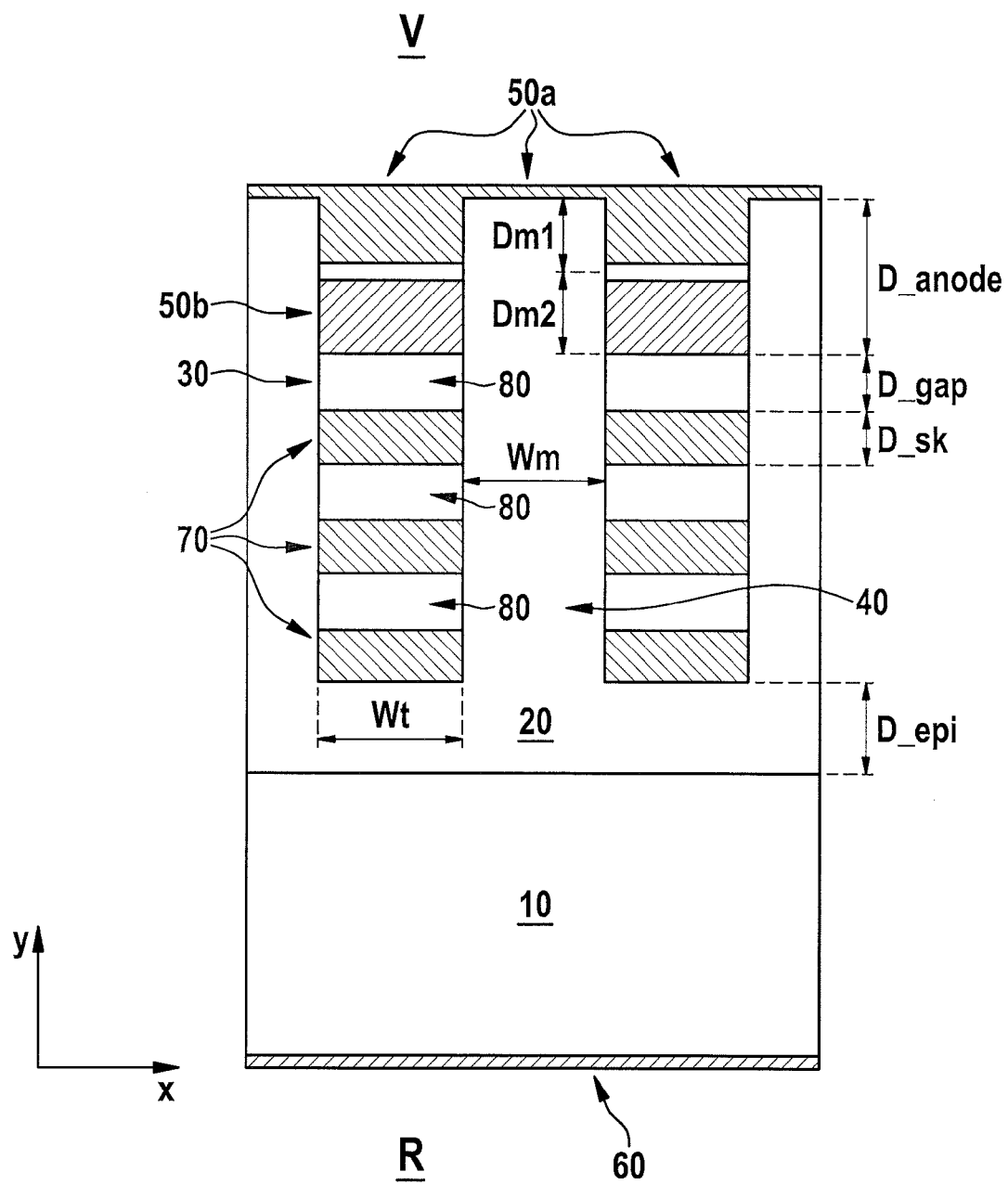
FIG. 3 shows a schematic representation of a super trench Schottky barrier Schottky diode (STSBS) according to another exemplary embodiment of the present invention.

Another exemplary embodiment of a Schottky diode according to the present invention is shown in FIG. 3. In contrast to the Schottky diode shown in FIG. 2, Schottky contacts 70, 50*a* and 50*b* bridge entire trench region 30. Between each of Schottky contacts 70 as well as between Schottky contact 50*b* and adjacent floating Schottky contact 70 are located dielectric layers 80, so that the individual floating Schottky contacts are isolated from one another and from Schottky contact 50*b*. Oxide layers are preferably used as dielectric layers.

What is claimed is:

1. A Schottky diode, comprising:
   an $n^+$-substrate;
   an n-epilayer;
   trenches introduced into the n-epilayer;
   mesa regions between adjacent trenches;
   a metal layer on a back face of the diode, the metal layer being used as a cathode electrode;
   an anode electrode provided on a front face of the diode, the anode electrode having two metal layers, a first metal layer forming a Schottky contact, and a second metal layer being situated below the first metal layer and also forming a Schottky contact; and
   additional, floating Schottky contacts situated on walls of the trenches between the second metal layer and bottoms of the trenches.

2. The Schottky diode according to claim 1, wherein the first metal layer and the second metal layer, each of which forms a Schottky contact, have different barrier heights.

3. The Schottky diode according to claim 2, wherein the second metal layer has a greater barrier height than the first metal layer.

4. The Schottky diode according to claim 1, wherein a distance (D_gap) is provided between the second metal layer and the additional Schottky contact adjacent to the second metal layer, and between the additional Schottky contacts.

5. The Schottky diode according to claim 1, wherein each of the additional Schottky contacts has a same barrier height as the second metal layer used as a Schottky contact.

6. The Schottky diode according to claim 1, wherein a field distribution in the mesa regions is repeated periodically according to a distance (D_sk+D_gap).

7. The Schottky diode according to claim 1, wherein a voltage distribution in the mesa regions is approximately linear.

8. The Schottky diode according to claim 1, wherein the Schottky contacts and the additional Schottky contacts cover an entire trench region, and dielectric layers are located between each of the Schottky contacts.

9. The Schottky diode according to claim 1, wherein all layers of the Schottky diode have a diametrically opposed conductivity type, and signs of the anode electrode and the cathode electrode are exchanged.

* * * * *